US008279028B2

(12) United States Patent  (10) Patent No.: US 8,279,028 B2
Yokoyama et al.  (45) Date of Patent: Oct. 2, 2012

(54) ELECTROMAGNETIC RELAY

(75) Inventors: Kenichi Yokoyama, Shinagawa (JP); Shigemitsu Aoki, Shinagawa (JP)

(73) Assignee: Fujitsu Component Limited, Tokyo (JP)

( * ) Notice: Subject to any disclaimer, the term of this patent is extended or adjusted under 35 U.S.C. 154(b) by 554 days.

(21) Appl. No.: 12/540,732

(22) Filed: Aug. 13, 2009

(65) Prior Publication Data

US 2010/0039196 A1  Feb. 18, 2010

(30) Foreign Application Priority Data

Aug. 15, 2008  (JP) ................................. 2008-209267

(51) Int. Cl.
*H01H 9/02* (2006.01)
*H01H 13/04* (2006.01)
(52) U.S. Cl. .............. 335/202; 335/78; 335/83; 335/85; 335/132; 361/773; 361/807
(58) Field of Classification Search .............. 335/78–86, 335/202, 128–132; 361/773, 776, 807, 808, 361/809; 439/483, 912, 912.1
See application file for complete search history.

(56) References Cited

U.S. PATENT DOCUMENTS

| 2,668,207 | A | * | 2/1954 | Bengtsson | ..................... 335/119 |
|---|---|---|---|---|---|
| 3,026,390 | A | * | 3/1962 | Koda | ............................. 335/152 |
| 3,621,112 | A | * | 11/1971 | Stickley et al. | ............. 174/50.52 |
| 4,626,812 | A | * | 12/1986 | Nakanishi et al. | ............. 335/132 |
| 4,812,794 | A | * | 3/1989 | Asbell et al. | ................... 335/151 |
| 5,343,365 | A | * | 8/1994 | Lueneburger | .................. 361/773 |
| 5,880,653 | A | * | 3/1999 | Yamada et al. | .................. 335/78 |
| 5,922,989 | A | * | 7/1999 | Tsunoda et al. | ............... 174/559 |
| 6,107,903 | A | * | 8/2000 | Sako et al. | ....................... 335/78 |
| 2008/0220665 | A1 | * | 9/2008 | Darr et al. | ....................... 439/842 |

FOREIGN PATENT DOCUMENTS

| JP | 6-24113 | 6/1994 |
| JP | 06283084 A * | 10/1994 |

* cited by examiner

*Primary Examiner* — Mohamad Musleh
(74) *Attorney, Agent, or Firm* — Staas & Halsey LLP

(57) ABSTRACT

An electromagnetic relay including a body, a plurality of first surface-mount terminals projecting from the body, and at least one second terminal projecting from the body. Each first terminal includes a distal end portion adapted to be mounted on a surface of a circuit board. The second terminal includes a distal end portion adapted to be inserted into a through-hole of a circuit board. The distal end portion of the second terminal is positioned farther away from the body than the distal end portion of the first terminal.

8 Claims, 3 Drawing Sheets

ELECTROMAGNETIC RELAY

BACKGROUND OF THE INVENTION

1. Field of the Invention

The present invention relates to an electromagnetic relay having surface-mount terminals.

2. Description of the Related Art

In recent years, surface-mounting technology has been increasingly adopted for mounting electric/electronic components on a circuit board provided in various electric apparatuses. This is also the case for an electromagnetic relay adapted to be mounted on a circuit board.

An electromagnetic relay includes various parts such as a coil, a movable contact member mechanically driven by the coil, etc., which are generally contained and supported in a housing for protection against external contaminants and thus constitute a relay body. External terminals are provided to project from the housing for mounting the electromagnetic relay on a circuit board and, in the case of a surface-mount-type electromagnetic relay, each external terminal is bent into an L-shape with the distal end portion thereof extending parallel to the bottom surface of the housing.

In a conventional surface-mounting process, solder is previously applied to a printed circuit board having wiring lines patterned thereon, at predetermined positions on which various electric/electronic components are to be mounted, and the components are then placed on the respective positions. Thereafter, the circuit board having the components placed thereon is passed through, e.g., a heating oven, so that the components and the solder are heated, and thereby the components are soldered to the printed circuit board.

Thus, the surface-mount-type electromagnetic relay is also mounted on the printed circuit board by soldering the distal end portions of the external terminals, extending parallel to the bottom surface of the body or housing, to the printed circuit board. During a time when the printed circuit board is passed through the heating oven in the soldering process, the electromagnetic relay including mechanically operating parts and thus having relatively large dimensions tends to become unstable.

Japanese Examined Utility Model Publication (Kokoku) No. 6-24113 (JP-6-24113-Y2) describes an electromagnetic relay including surface-mount-type terminals projecting from the bottom surface of a relay body and a projection also projecting from the bottom surface, the projection having a height less than the height of each terminal. The projection is adapted to be adhered onto a printed circuit board by an adhesive prior to a soldering process, and thus acts to prevent the electromagnetic relay from being shifted during the soldering process, i.e., when the electromagnetic relay is passed through a heating oven.

In an electromagnetic relay having relatively large dimensions, when the electromagnetic relay is subjected to heat in the soldering process or when heat is generated during the operation of the electromagnetic relay, a relatively large thermal stress is likely to be produced in the external terminals soldered to the printed circuit board, due to the difference in linear thermal expansion coefficient between the printed circuit board and the housing of the electromagnetic relay.

SUMMARY OF THE INVENTION

It is an object of the present invention to provide an electromagnetic relay capable of reducing thermal stress produced in surface-mount-type terminals, and improving reliability of a surface mounting configuration and of an apparatus including the electromagnetic relay.

One aspect of the present invention provides an electromagnetic relay comprising a body; a plurality of first terminals projecting from the body, each first terminal including a distal end portion adapted to be mounted on a surface of a board; and a second terminal projecting from the body, the second terminal including a distal end portion adapted to be inserted into a through-hole of a board; wherein the distal end portion of the second terminal is positioned farther away from the body than the distal end portion of the first terminal.

The distal end portion of the second terminal may comprises a tip end adapted to penetrate through the through-hole, or alternatively a press-fit end adapted to be press-fitted into the through-hole. The second terminal may have electrical conducting properties, or may not have electrical conducting properties.

The distal end portion of the first terminal may be located along a virtual horizontal plane common to all of the first terminals.

The first terminals may include two sets of first terminals, one set being arranged along a first edge of a bottom surface of the body and another set being arranged along a second opposite edge of the bottom surface. In this arrangement, the second terminal may be disposed at a location between the two sets of first terminals.

BRIEF DESCRIPTION OF THE DRAWINGS

The above and other objects, features and advantages of the present invention will become more apparent from the following description of preferred embodiments in connection with the accompanying drawings, wherein.

DESCRIPTION OF THE PREFERRED EMBODIMENT

Figure 1A:
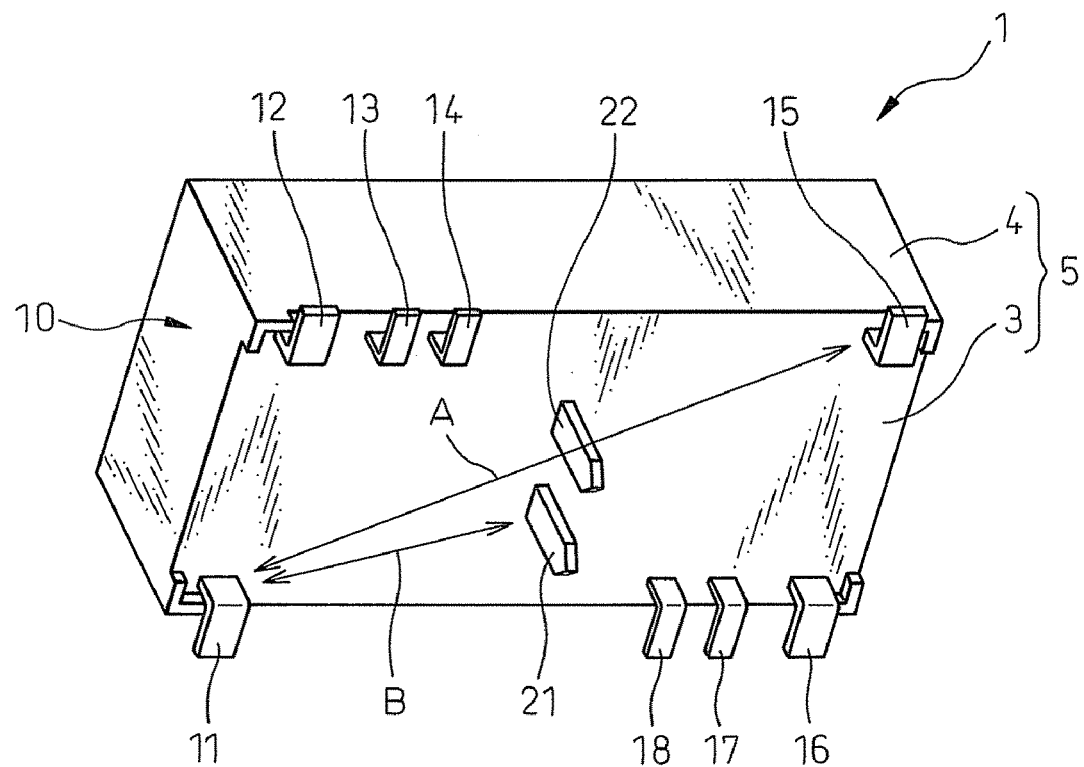
FIG. 1A is a perspective view schematically showing an electromagnetic relay according to an embodiment of the present invention.

The embodiments of the present invention are described below in detail, with reference to the accompanying drawings. In the drawings, the same or similar components are denoted by common reference numerals.

Figure 1B:
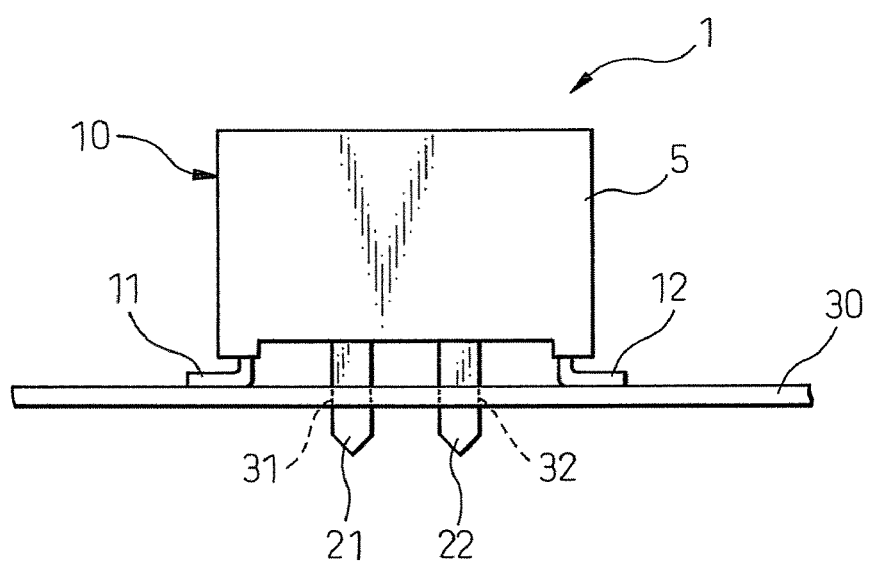
FIG. 1B is a side view schematically showing the electromagnetic relay of FIG. 1A in a state where the electromagnetic relay is mounted to a printed circuit board.

Referring to the drawings, FIG. 1A schematically shows an electromagnetic relay 1 according to an embodiment of the present invention, and FIG. 1B schematically shows the electromagnetic relay 1 mounted to a printed circuit board 30.

The electromagnetic relay 1 includes a body 10 constituted from a housing 5 having a rectangular parallelepiped shape and various parts (not shown), such as a coil, contained inside the housing 5. The housing 5 includes a base 3 supporting the various parts attached thereto and an upper casing 4 attached to the base 3 so as to surround the various parts. A plurality of external terminals are provided to project from the base 3 or the bottom surface of the body 10.

Some of the external terminals are bent into L-shapes and thus form first surface-mount-type terminals (hereinafter referred to as surface-mount terminals) 11-18, each having a distal end portion extending parallel to the base 3 or the bottom surface of the body 10. The distal end portions of the surface-mount terminals 11-18 are located along a virtual horizontal plane common to all of the surface-mount terminals 11-18. As a result, the electromagnetic relay 1 can be placed on the printed circuit board 30, as shown in FIG. 1B, in such a manner that all of the distal end portions of the surface-mount terminals 11-18 are brought into contact with the surface of (or electrodes patterned on) the printed circuit board 30. The electromagnetic relay 1 is configured so as to be mounted to the printed circuit board 30 through a surface-mounting process, i.e., by soldering the surface-mount terminals 11-18 to the printed circuit board 30 in the state shown in FIG. 1B.

The surface-mount terminals 11-18 are arranged so as to project from respective regions defined along the two mutually opposed longitudinal edges of the base 3, with the distal end portions of the surface-mount terminals 11-18 extending outward relative to the longitudinal centerline of the base 3. In other words, the surface-mount terminals 11-18 include two sets of terminals, one set of terminals 11, 16-18 being arranged along the first edge of the base 3 or the bottom surface of the body 10, and another set of terminals 12-15 being arranged along a second opposite edge of the base 3 or the bottom surface. The distal end portions of the first set of terminals 11, 16-18 arranged along the first edge of the base 3 extend in a first outward direction, and the distal end portions of the second set of terminals 12-15 arranged along the second edge of the base 3 extend in a second outward direction opposite to the first direction, i.e., the distal end portions of the first set of terminals 11, 16-18 and the distal end portions of the second set of terminals 12-15 extend away from each other. Due to the above arrangement of the surface-mount terminals 11-18, the electromagnetic relay 1 can be stably supported on the printed circuit board 30, and also can be prevented from falling down on the printed circuit board 30.

The other of the external terminals are second through-hole insertion type terminals (hereinafter referred to as through-hole terminals) 21, 22 arranged near the center of the base 3 or the bottom surface of the body 10. The through-hole terminals 21, 22 extend straightly from the base 3, and project higher than the surface-mount terminals 11-18, i.e., outwardly beyond the virtual horizontal plane in which the distal end portions of the surface-mount terminals 11-18 extend. In other words, the distal end portions of the through-hole terminals 21, 22 are positioned farther away from the body 10 than the distal end portions of the surface-mount terminals 11-18. As a result, when the electromagnetic relay 1 is placed on the printed circuit board 30 with the distal end portions of the surface-mount terminals 11-18 contacting with the surface of the printed circuit board 30, as shown in FIG. 1B, the through-hole terminals 21, 22 are inserted into through-holes 31, 32, respectively, which are formed in advance at corresponding positions in the printed circuit board 30. The distal end portion of each through-hole terminal 21, 22 is provided with a tip end adapted to penetrate through each through-hole 31, 32.

The body 10 of the electromagnetic relay 1 may have various known configurations. For example, the electromagnetic relay 1 may include two coils and movable contact members respectively provided to the coils. In this configuration, the surface-mount terminals 13, 14 may be provided as coil terminals for energizing a first coil, and the surface-mount terminals 17, 18 may be provided as coil terminals for energizing a second coil. The through-hole terminals 21, 22 may be provided as common terminals for the respective movable contact members. The surface-mount terminals 11, 12 may be provided as make and break terminals for the first coil, respectively, the make terminal being brought into a conduction state and the break terminal being brought into a non-conduction state when the first coil is energized, while the surface-mount terminals 15, 16 may be provided as make and break terminals for the second coil, respectively.

In the electromagnetic relay 1 of the above embodiment, the provision of the through-hole terminals 21, 22 makes it possible to reduce thermal stress produced in the surface-mount terminals 11-18. If the through-hole terminals 21, 22 are not provided, thermal stress produced in, e.g., the diagonally opposing surface-mount terminals 11, 15, due to a difference in the amount of thermal expansion between the printed circuit board 30 and the base 3, is relatively large, because of a relatively long diagonal distance between the surface-mount terminals 11, 15, as shown by an arrow A, which may cause an accumulation of the thermal stress. Contrary to this, the electromagnetic relay 1 provided with the through-hole terminals 21, 22 is securely and firmly fixed to the base 3 by the insertion of the through-hole terminals 21, 22 into the through-holes 31, 32, so that it is possible to prevent thermal stress from being transmitted across the through-hole terminals 21, 22. In other words, thermal stress, which may otherwise be produced in the surface-mount terminals 11, 15 due to the long diagonal distance therebetween, is divided in half due to the provision of the through-hole terminals 21, 22 inserted into the through-holes 31, 32 and thus exerting high resistivity to a shearing force. Therefore, each of the surface-mount terminals 11, 15 is subjected to a less thermal stress produced due to a difference in the amount of thermal expansion between the printed circuit board 30 and the base 3, which is accumulated in a distance between each surface-mount terminal 11, 15 and the through-hole terminals 21, 22, as shown by an arrow B, which is approximately a half the distance of the arrow A.

The above technical matter is also the case for the other surface-mount terminals 12-14, 16-18. More specifically, thermal stress produced in the diagonally opposing surface-mount terminals (12 and 16; 13 and 17; 14 and 18) is reduced to generally half, due to the provision of the through-hole terminals 21, 22 located at the middle of the diagonally opposing surface-mount terminals. Thus, the arrangement of the through-hole terminals 21, 22 near the center of the base 3, thermal stress produced in each of the surface-mount terminals 11-18 can be reduced. In this connection, in order to ensure the advantageous effect for reducing the thermal stress applied to the surface-mount terminals 11-18 by the provision of the through-hole terminals 21, 22 positioned between the surface-mount terminals 11-18, it is preferable that the through-hole terminals 21, 22 are arranged to project at least from a region located between the regions along the opposed longitudinal edges of the base 3, from which the surface-mount terminals 11-18 project. In other words, the through-hole terminals 21, 22 are preferably disposed at a location between two sets of surface-mount terminals 11-18 arranged along the opposed longitudinal edges of the base 3.

Due to the above-mentioned effects, i.e., the reduction of thermal stress produced in each of the surface-mount terminals 11-18, it is possible, in a surface-mounting process, to reduce stress applied to the surface-mount terminals 11-18 during heating in a heating furnace for a soldering process, and to improve the performance of soldering on the terminals and thus improve the reliability of a surface mounting configuration of the electromagnetic relay 1. It is also possible to reduce thermal stress caused by heating-up of an apparatus including the electromagnetic relay 1 during the operation of the apparatus, or especially by heating-up of electronic elements and/or the electromagnetic relay 1 mounted on the printed circuit board 30. Thus, the reliability of an apparatus having the electromagnetic relay 1 installed therein can be improved.

The provision of the through-hole terminals 21, 22 also serves to limit the location of the electromagnetic relay 1 on the printed circuit board 30 by inserting the through-hole terminals 21, 22 through the through-holes 31, 32 of the printed circuit board 30. Thus, the positioning of the electromagnetic relay 1 on the printed circuit board 30 in a surface mounting process can be simplified.

It should be understood that the above-described embodiment shown in FIGS. 1A and 1B is only illustrative of the present invention, and various changes or modifications can be made within the scope of the invention as defined in the appended claims. For example, in the above-described embodiment, the through-hole terminals 21, 22 are formed to project from the generally center region of the base 3, and this configuration is preferred to ensure the effective reduction of thermal stress as described above. However, the through-hole terminals may be disposed at other various positions, provided that it is possible to prevent thermal stress from being transmitted across the through-hole terminals 21, 22, and thereby reduction of thermal stress can be ensured.

In the above-described embodiment, the through-hole terminals 21, 22 may be provided as common terminals having electrical conducting properties. However, the through-hole terminals 21, 22 may be provided as dummy terminals, which do not have electrical conducting properties and are not electrically connected to components of the electromagnetic relay 1, i.e., which serve only to mechanically fasten the electromagnetic relay 1 to the circuit board 30. In this configuration, for example, the surface-mount terminals 11, 15 may be used as common terminals, and the surface-mount terminals 12, 16 may be used as make or break terminals so as to meet the requirement of an electric circuit including the relay 1. Alternatively, additional surface-mount terminals acting as make or break terminals may be provided as an occasion demands. Also in this configuration, only a single dummy terminal may be used.

Figure 2:
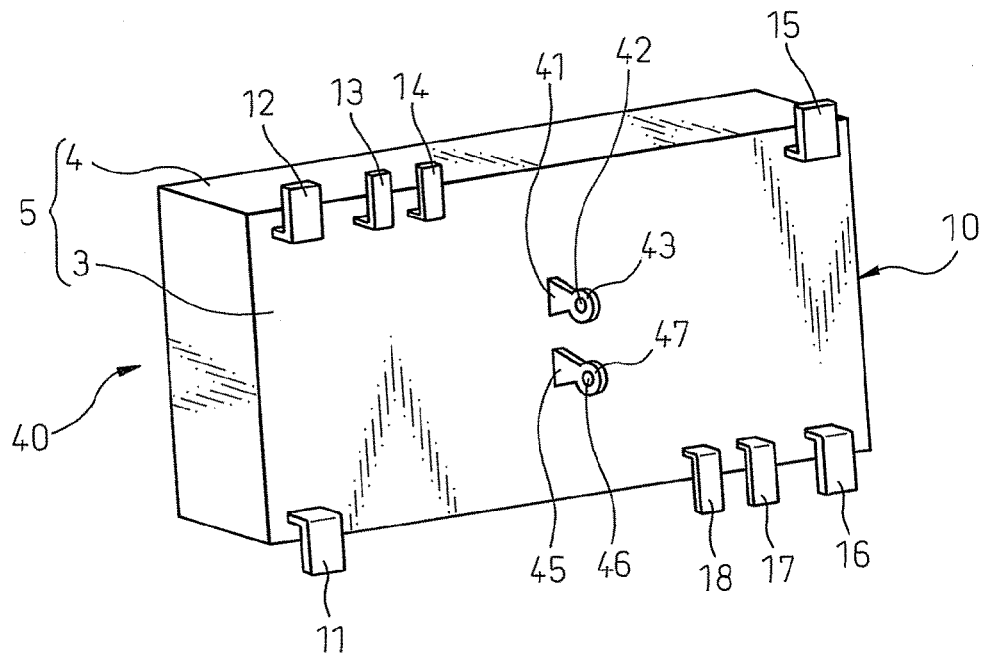
FIG. 2 is a perspective view schematically showing an electromagnetic relay according to a modification of the electromagnetic relay of FIG. 1.

Further, as shown in FIG. 2, through-hole terminals 41, 45 configured as press-fit terminals may be used, in place of the through-hole terminals 21, 22, as essential components of an electromagnetic relay 40. The distal end portion of each through-hole terminal 41, 45 is provided with a press-fit end adapted to be press-fitted into a through-hole (e.g., a through hole 31 or 32 shown in FIG. 1B). More specifically, the through-hole terminals 41, 45 formed to project from the generally center region of the base 3 of the electromagnetic relay 40 have ring-shaped end portions 43, 47 having openings 42, 46 formed therein. The ring-shaped end portions 43, 47 are formed to be slightly larger in dimensions than through-holes formed in a not-shown printed circuit board. Consequently, when the through-hole terminals 41, 45 are inserted into the through-holes, the ring-shaped portions 43, 47 are elastically deformed so as to exert a pressing force due to an elastic restoring force onto the inner peripheral surface of the through-holes, and thus are attached to or press-fitted into the through-holes. The through-hole terminals 41, 45 are thereby mechanically fastened and electrically connected to the circuit board. According to this configuration, the through-hole terminals 41, 45 do not need to be soldered to the circuit board, and the fabrication process thereby can be simplified.

Figure 3:
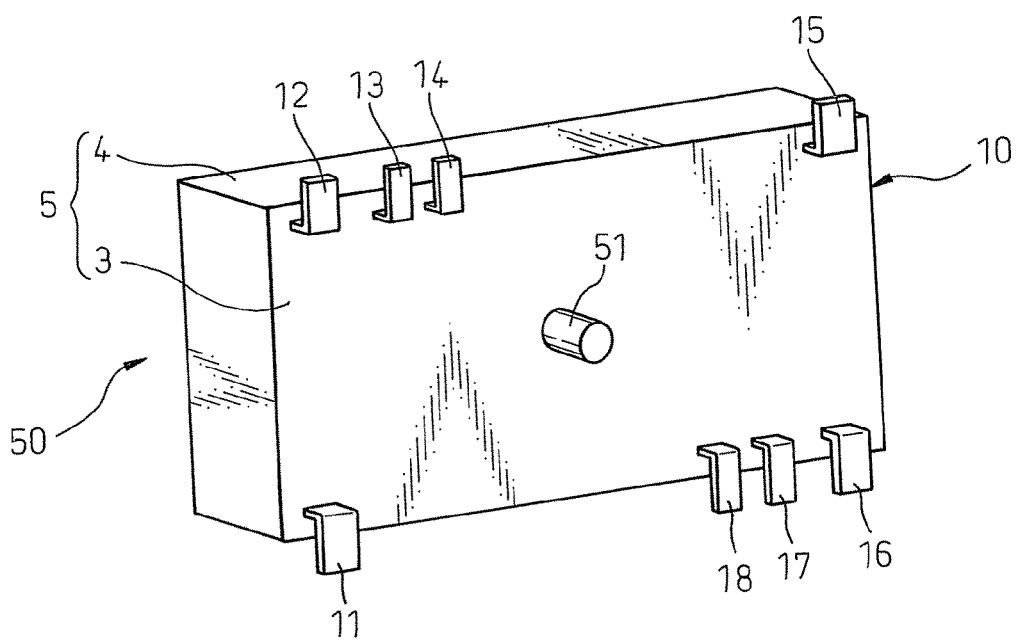
FIG. 3 is a perspective view schematically showing an electromagnetic relay according to another modification of the electromagnetic relay of FIG. 1.

In a case where, at a generally center region of the base 3, an electrical connection is not required and only mechanical fastening is required, a single press-fit protrusion 51 may be used as a modification of a dummy terminal or a press-fit terminal, which is an essential component of an electromagnetic relay 50 shown in FIG. 3. The press-fit protrusion or terminal 51 has the amount of protrusion larger than that of each of the surface-mount terminals 11-18, as measured in a direction perpendicular to the base 3. In other words, the distal end portion of the press-fit protrusion 51 is positioned farther away from the body 10 than the distal end portion of each surface-mount terminal 11-18. The press-fit protrusion 51 shown in FIG. 3 is formed to have a cylindrical shape with a diameter slightly larger than the diameter of a circular opening (or a through hole) formed in a not-shown printed circuit board. Consequently, when the electromagnetic relay 50 is mounted to the printed circuit board, the press-fit protrusion 51 is press-fitted into the opening formed in the printed circuit board. Thus, it is not necessary to solder the press-fit protrusion 51 to the printed circuit board.

The press-fit protrusion 51 may be formed by molding, etc., and may also be integrally molded as a unitary structure with the base 3 or body 10. Alternatively, the press-fit protrusion 51 may be fastened to the base 3 by adhesion or fitting. The press-fit protrusion is not limited to have a cylindrical shape, but may have any shapes or structures so as to correspond to the shape or structure of the opening formed in the printed circuit board, provided that the press-fit protrusion 51 can be fastened to the opening by press-fitting.

Figure 4:
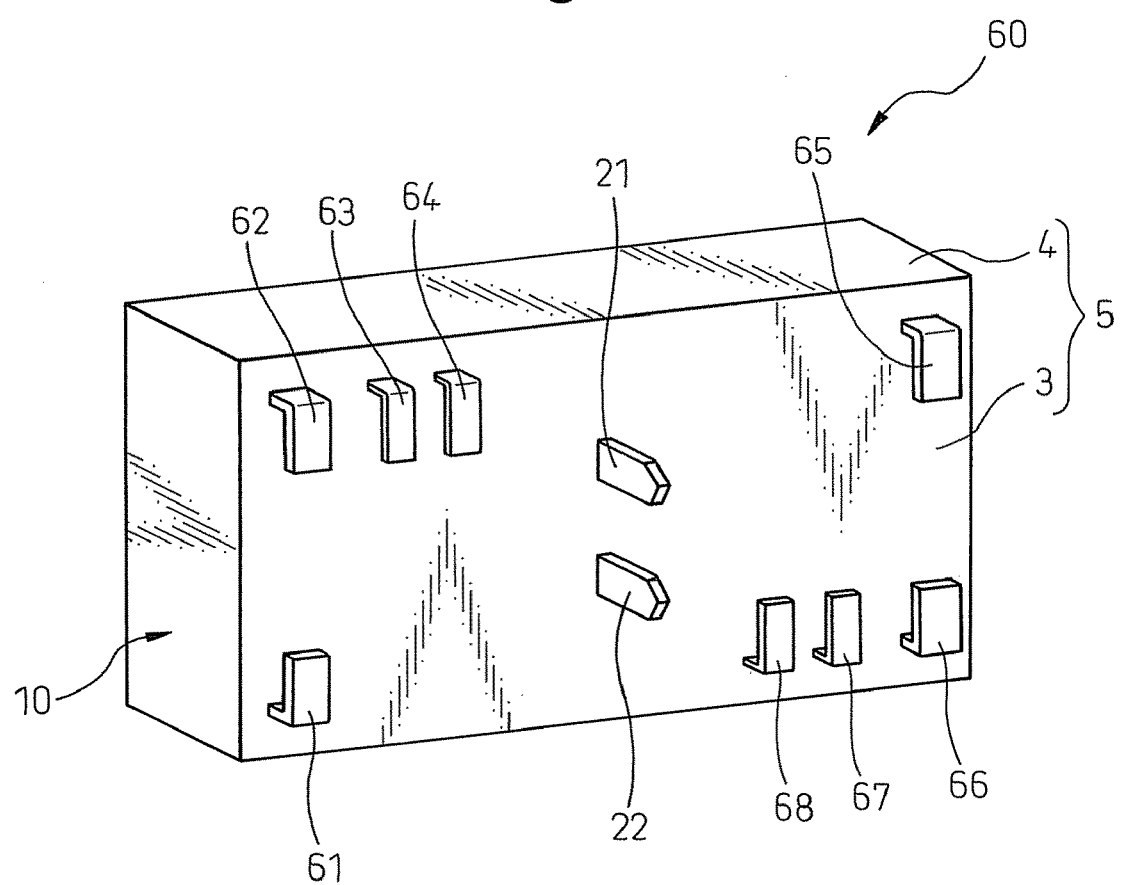
FIG. 4 is a perspective view schematically showing an electromagnetic relay according to still another modification of the electromagnetic relay of FIG. 1.

The above-described electromagnetic relays 1, 40, 50 have a configuration wherein the distal end portions of the first set of terminals 11, 16-18 arranged along the first edge of the base 3 and the distal end portions of the second set of terminals 12-15 arranged along the second edge of the base 3 extend away from each other. Contrary to this, as shown in FIG. 4, an electromagnetic relay 60 may be configured to have surface-mount terminals 61-68 having distal end portions extending parallel to the base 3 and extending inward to the longitudinal centerline of the base 3. In other words, the distal end portions of the first set of terminals 61, 66-68 arranged along the first edge of the base 3 and the distal end portions of the second set of terminals 62-65 arranged along the second edge of the base 3 extend toward each other. According to the configuration wherein the surface-mount terminals 61-68 with the distal end portions extending inward, the area of the printed circuit board required for mounting the electromagnetic relay 50 is reduced as compared to the area of the printed circuit board required for mounting the electromagnetic relay 1, 40, 50 in which the surface-mount terminals 11-18 with the distal end portions extending outward, and thereby a space saving can be facilitated.

In this connection, the surface-mount terminals 61-68 with the distal end portions extending inward may exert less supporting force against the rotation of the electromagnetic relay 60 about the longitudinal centerline thereof, as compared to the surface-mount terminals 11-18 with the distal end portions extending outward. However, according to the configuration as shown in FIG. 4, the through-hole terminals 21, 22 provide improved stability of connection of the electromagnetic relay 60 to the printed circuit board, and a sufficient mounting reliability can be thereby achieved.

As described above, according to the present invention, the provision of the through-hole terminals makes it possible to prevent thermal stress from transmitting or accumulating across the center region of the relay body to be applied to the surface-mount terminals, even in a relatively large electromagnetic relay. Therefore, it is possible to reduce thermal stress produced in the surface-mount terminals, and thus improve reliability of a surface mounting configuration and of an apparatus including the electromagnetic relay installed therein.

While the invention has been described with reference to specific preferred embodiments, it will be understood by those skilled in the art that various changes and modifications may be made thereto without departing from the scope of the following claims.

The invention claimed is:

1. An electromagnetic relay comprising:
a body;
a plurality of first terminals projecting from said body, each first terminal including a distal end portion adapted to be mounted on a surface of a board; and
a second terminal projecting from said body, said second terminal including a distal end portion adapted to be inserted into a through-hole of the board,
wherein said distal end portion of said second terminal is positioned farther away from said body than said distal end portion of said first terminal, and
wherein said second terminal does not have electrical conducting properties and is not electrically connected to components of the electromagnetic relay.

2. The electromagnetic relay of claim 1, wherein said distal end portion of said second terminal comprises a tip end adapted to penetrate through the through-hole.

3. The electromagnetic relay of claim 1, wherein said distal end portion of said second terminal comprises a press-fit end adapted to be press-fitted into the through-hole.

4. The electromagnetic relay of claim 1, wherein said second terminal is integrally molded with said body.

5. The electromagnetic relay of claim 1, wherein said distal end portion of said first terminal is located along a virtual horizontal plane common to all of said first terminals.

6. The electromagnetic relay of claim 1, wherein said first terminals include two sets of first terminals, one set being arranged along a first edge of a bottom surface of said body and another set being arranged along a second opposite edge of said bottom surface; and wherein said second terminal is disposed at a location between said two sets of first terminals.

7. The electromagnetic relay of claim 6, wherein said set of first terminals arranged along said first edge and said set of first terminals arranged along said second edge include distal end portions extending away from each other.

8. The electromagnetic relay of claim 6, wherein said set of first terminals arranged along said first edge and said set of first terminals arranged along said second edge include distal end portions extending toward each other.

* * * * *